United States Patent
Ito et al.

(10) Patent No.: US 9,000,546 B2
(45) Date of Patent: Apr. 7, 2015

(54) SPIN-WAVE WAVEGUIDE AND SPIN WAVE OPERATION CIRCUIT

(71) Applicant: Hitachi Ltd., Tokyo (JP)

(72) Inventors: Kenchi Ito, Kunitachi (JP); Masaki Yamada, Kokubunji (JP); Susumu Ogawa, Fujimi (JP)

(73) Assignee: Hitachi, Ltd., Tokyo (JP)

( * ) Notice: Subject to any disclaimer, the term of this patent is extended or adjusted under 35 U.S.C. 154(b) by 44 days.

(21) Appl. No.: 13/693,110

(22) Filed: Dec. 4, 2012

(65) Prior Publication Data

US 2013/0147579 A1 Jun. 13, 2013

(30) Foreign Application Priority Data

Dec. 9, 2011 (JP) ................. 2011-269558

(51) Int. Cl.
| | | |
|---|---|---|
| H01L 29/82 | (2006.01) | |
| G11C 11/02 | (2006.01) | |
| H01P 3/16 | (2006.01) | |
| G11C 11/16 | (2006.01) | |
| H01F 10/32 | (2006.01) | |
| H01L 43/08 | (2006.01) | |

(52) U.S. Cl.
CPC ................ H01P 3/165 (2013.01); G11C 11/16 (2013.01); H01F 10/3254 (2013.01); H01L 43/08 (2013.01)

(58) Field of Classification Search
USPC ........ 257/20, 414, 421–427, E29.323; 438/3; 365/157–158; 360/324–326, 313
See application file for complete search history.

(56) References Cited

U.S. PATENT DOCUMENTS

| | | | |
|---|---|---|---|
| 7,764,538 B2* | 7/2010 | Ito ................................. | 365/158 |
| 2008/0231392 A1 | 9/2008 | Kim et al. | |
| 2011/0102106 A1* | 5/2011 | Kim et al. ..................... | 333/186 |

FOREIGN PATENT DOCUMENTS

JP 2009-508353 A 2/2009

OTHER PUBLICATIONS

Jedema et al., "Electrical detection of spin precession in a metallic mesoscopic spin valve", Nature, Apr. 18, 2002, pp. 713-716, vol. 416.
Khitun et al., "Spin Wave Magnetic NanoFabric: A New Approach to Spin-Based Logic Circuitry", IEEE Transactions on Magnetics, Sep. 9, 2008, pp. 2141-2152, vol. 44, No. 9.
Khitun et al., "Non-volatile magnonic logic circuits engineering", Journal of Applied Physics, 2011, pp. 034306-1 to 034306-11, vol. 110.
Nature Materials, vol. 9, pp. 721-724, 2010.

* cited by examiner

*Primary Examiner* — Jami M Valentine
(74) *Attorney, Agent, or Firm* — Mattingly & Malur, P.C.

(57) ABSTRACT

A spin-wave waveguide includes a ferromagnetic thin film resembling a wire in shape. A part of the ferromagnetic thin film, large in film thickness, is formed at one end of the ferromagnetic thin film, and a part of the ferromagnetic thin film, small in film thickness, and a part of the ferromagnetic thin film, large in film thickness, are alternately formed on the same plane, for at least not less than one cycle. A part of the ferromagnetic thin film, large in film thickness, is formed at the other end of the ferromagnetic thin film, wherein an insulating film, and an electrode film are stacked in this order on the ferromagnetic thin film in the part of the ferromagnetic thin film, large in film thickness.

16 Claims, 10 Drawing Sheets

| TIMING | ACTION |
|---|---|
| T1 | WRITE INFORMATION TO A1, B1, AND C1, RESPECTIVELY (V > Vth) |
| T2 | TRANSMIT THE INFORMATION FROM C1 TO C1', FROM A1 TO A1', AND FROM B1 TO B1' |
| T3 | TRANSMIT (COMPUTE) THE INFORMATION FROM C1' (ON THE RIGHT) TO C2 |
| T4 | TRANSMIT (COMPUTE) THE INFORMATION FROM A1', B1, C1' (ON THE LEFT) TO O1 AND FROM A1', B1' TO C2 |
| T5 | TRANSIT THE INFORMATION FROM C2 TO C2 IN AN ADJACENT BLOCK TO READ THE INFORMATION OF O1 |
| T6 | WRITE INFORMATION TO A2, B2 AND TRANSMIT THE INFORMATION FROM C2 TO C2' |
| T7 | TRANSMIT THE INFORMATION FROM C2 TO C2', FROM A2 TO A2', AND FROM B2 TO B2' |
| T8 | TRANSMIT (COMPUTE) THE INFORMATION FROM C2' TO C3 |
| T9 | TRANSMIT (COMPUTE) THE INFORMATION FROM A2', B2, C2 TO O2, AND FROM A2', B2' TO C3 |
| T10 | TRANSMIT THE INFORMATION FROM C3 TO C3 IN AN ADJACENT BLOCK TO READ THE INFORMATION OF O2 |

FIG. 8

| TIMING | ACTION |
|---|---|
| T1 | WRITE INFORMATION TO A1, B1, AND C1, RESPECTIVELY (V > Vth) |
| T2 | TRANSMIT THE INFORMATION FROM A1 TO A1' AND FROM B1 TO B1' |
| T3 | TRANSMIT (COMPUTE) THE INFORMATION FROM A1', B1', C1 TO O1 |
| T4 | TRANSMIT THE INFORMATION FROM C1 TO C2 TO READ THE INFORMATION OF O1 |
| T5 | TRANSMIT (COMPUTE) THE INFORMATION FROM A1', B1' TO C2 |
| T6 | WRITE INFORMATION TO A2, B2, AND TRANSIT THE INFORMATION FROM C2 TO C2 IN AN ADJACENT BLOCK |
| T7 | TRANSMIT THE INFORMATION FROM A2 TO A2' AND FROM B2 TO B2' |
| T8 | TRANSMIT (COMPUTE) THE INFORMATION FROM A2', B2', C2 TO O1 |
| T9 | TRANSMIT THE INFORMATION FROM C2 TO C3 TO READ THE INFORMATION OF O2 |
| T10 | TRANSMIT (COMPUTE) THE INFORMATION FROM A2', B2' TO C3 |

SPIN-WAVE WAVEGUIDE AND SPIN WAVE OPERATION CIRCUIT

CLAIM OF PRIORITY

The present application claims priority from Japanese patent application JP 2011-269558 filed on Dec. 9, 2011, the content of which is hereby incorporated by reference into this application.

FIELD OF THE INVENTION

The present invention relates to a waveguide, and an element, using a spin wave as an information-transmission medium, and an operation circuit using the waveguide.

BACKGROUND OF THE INVENTION

While information content to be processed in a unit time has exponentially increased along with an explosive development in the information society, a dramatic decrease in energy made available for use in information-processing has been in strong demand from the standpoint of the global environment, and energy constraints. With a semiconductor operation element based on a CMOS, available up to now, performance has increased along with miniaturization, however, an increase in power consumption, induced by an increase in leakage current loss increasing due to the miniaturization, and AC loss together with joule loss, occurring when current flows through an interconnection, has become pronounced, so that it has become difficult to enhance a working speed. In order to cope with this situation, countermeasures have been taken for turning a block power off without using multi-cores whereby a plurality of processors are disposed, power gating, and so forth. It is deemed, however, that there is a limitation to any of the countermeasures.

Attention has lately been focused on a spin flow for transmitting information by means of a flow of spin without being accompanied by current flow, as a technology for realizing lower power consumption. Two types of spin flows exist in the spin flow, including an electron spin flow in which an electron propagating on a Fermi surface is a carrier, as described in, for example, Non-patent Document 1 {Nature, Vol. 416, pp. 713-715 (2002)}, and a spin-wave spin flow in which precession of spin constrained by a atom propagates in a ferromagnetic waveguide. The spin wave among them is relatively long, being in a range of several tens of μm to several cm, so that application of the spin wave to an operation circuit large in scale is hoped for.

There have been disclosed a method for effectively generating a spin wave, and a method for controlling a phase of a spin wave in, for example, in Japanese Unexamined Patent Application Publication No. 2009-508353, and further, an information-processing device making use of the fluctuating nature of reflection, refraction, transmission, interference, and so forth of a spin wave has also been disclosed therein. Further, in Non-patent Document 2 {IEEE TRANSACTIONS ON MAGNETICS, VOL. 44, NO. 9, pp. 2141-2150 (2008)}, there have been disclosed specific logic operation circuits using a spin wave (an AND circuit, an OR circuit, a NAND, a NOR circuit, and so forth) in addition to a method for exciting a spin wave, a method for detecting a spin wave, and a method for controlling a spin wave phase, thereby pointing to significant reduction in power consumption.

Still further, in Non-patent Document 3 {JOURNAL OF APPLIED PHYSICS, VOL. 110, p. 034306 (2011)}, there have been disclosed a spin wave operation circuit compatible with a present-day synchronous operation circuit where write-information is computed by use of a spin wave to be subsequently stored, thereby proceeding with the next information-processing. The content of the information-processing is briefly described hereinafter.

Figure 1:
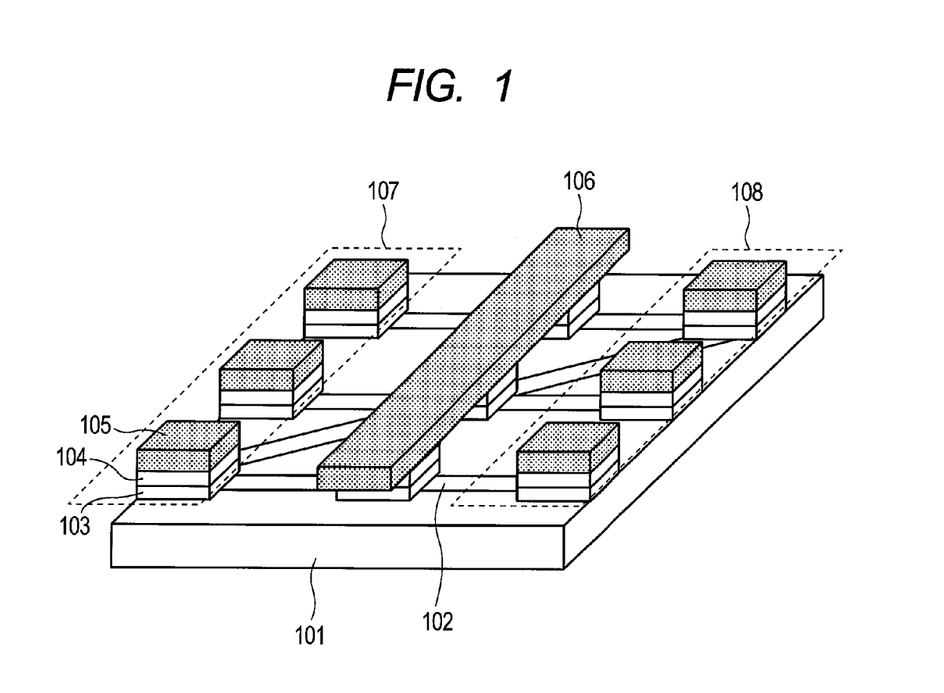
FIG. 1 is a view showing an example of the operation circuit according to the related art, using a spin-wave waveguide.

FIG. 1 is a view schematically showing the spin wave operation circuit disclosed in the Non-patent Document 3. Reference numeral 101 denotes an Si substrate, 102 a spin-wave waveguide wire-like (linear) in shape, 103 a ferromagnetic film made of Ni, and so forth, having an easy axis of magnetization in the longitudinal direction thereof, 104 a ferroelectric film made of PTZ, and so forth, 105 a metal electrode material film, made of Al, and so forth, and 106 a line of a metal material made of Al, and so forth. Reference numeral 107 denotes a region for exciting a spin wave, and 108 a detection region for detecting a spin wave. In this circuit, an operation using the spin wave is executed as follows. 103, 104, and 105 each indicate a magnetoelectric (ME) effect element capable of controlling the magnetic anisotropy direction of the ferromagnetic film 103 upon application of an electric field.

Further, description is given hereinafter with reference to an xyz coordinate system shown in FIG. 1. With the present invention, a direction vertical to a film surface is a z-axis direction, and a direction parallel with the film surface is a direction within an x-y plane.

Upon application of the electric field +, or − (More specifically, upward, or downward in the perpendicular direction) to the element, information "0", or "1" is written to the ferromagnetic film 103. Next, an electric field identical in polarity to the +, or − electric field is applied to excite a spin wave. While the spin wave propagates through the waveguide to reach the Ni film in the lower part of the electrode line 106, a first operation is executed by making use of the fluctuating nature of the spin wave, and the result thereof is recorded in the Ni film. Next, while the electrode line 106 is activated to cause a spin wave to be excited again, and the spin wave propagates through the waveguide to reach the detection region 108, a second operation is executed by making use of the fluctuating nature of the spin wave, and the result thereof is recorded in the Ni film present in the region 108. The result of the operation is electrically detected via the ME effect elements present in the region 108.

Figure 2A:
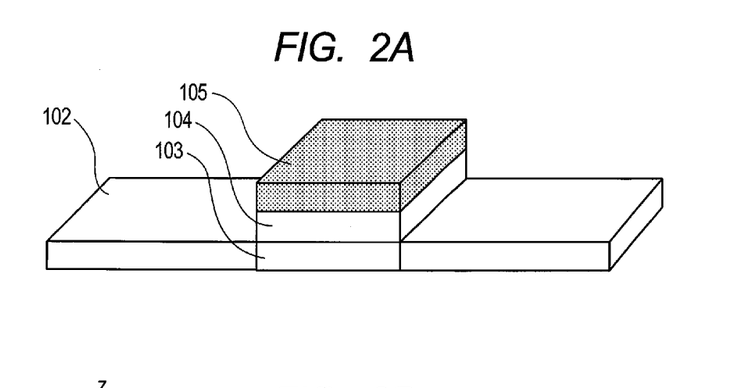
FIGS. 2A, 2B and 2C are views showing the spin-wave waveguide according to the related art.
Figure 2B:
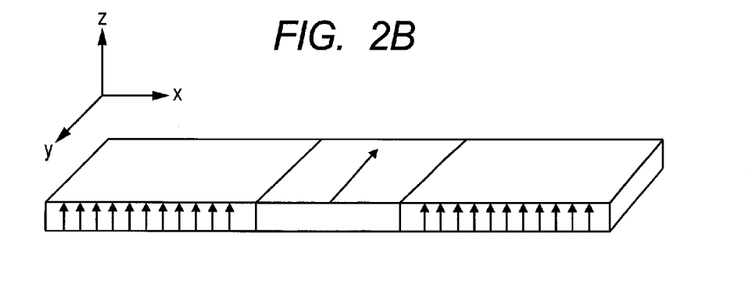
Figure 2C:
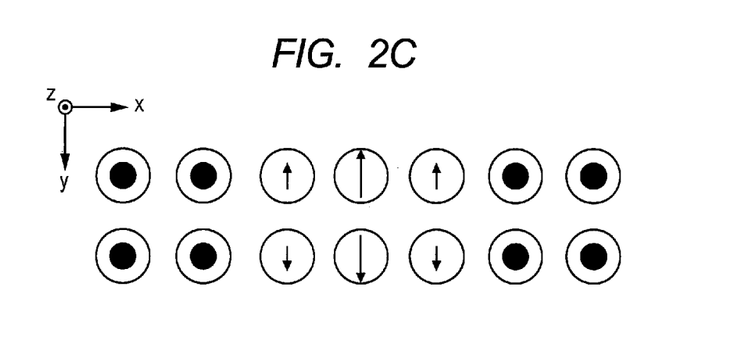

FIGS. 2A to 2C each are a view showing the spin-wave waveguide 102, and the ME effect element in greater detail. In the spin-wave waveguide, magnetization of a ferromagnetic material is oriented in the perpendicular direction, as shown in FIG. 2B. In contrast, the Ni film 103 has the easy axis of magnetization in the longitudinal direction thereof, however, because the Ni film is magnetically coupled to a ferromagnetic film 102 of perpendicular magnetization, a magnetization direction thereof is unable to be oriented fully in the longitudinal direction, the magnetization direction is therefore oriented in a direction between the perpendicular/the longitudinal, as shown in FIG. 2C. Since one stabilization point exists in the respective directions of +y/−y, the information "0", or "1" can be written to the Ni film.

SUMMARY OF THE INVENTION

However, the spin-wave operation circuit described as above has the following problem.

The spin-wave operation circuit described in {IEEE TRANSACTIONS ON MAGNETICS, VOL. 44, NO. 9, pp. 2141-2150 (2008)} is not provided with a mechanism whereby an operation is sequentially progressed according to a clock, so that it is impossible to make use of asynchronous information-processing method that is in the mainstream at present, and applicability is considerably restricted. The spin wave operation circuit described in {JOURNAL OF APPLIED PHYSICS, VOL. 110, p. 034306 (2011)} is improved in this respect.

However, with the operation circuit described as above, the ME effect element used for writing, and excitation of the spin wave is an element made up by coupling a ferromagnetic material to a ferroelectric material, so that the ME effect element goes into complex actions such as (1) distortion being induced in the ferroelectric material by applying a voltage to the ferroelectric material, and (2) magnetic anisotropy of the ferromagnetic material being modulated due to a magnetostriction effect caused by the distortion as induced. A high-performance ME effect element operating at room temperature has not been available up to now. Further, attention is being focused on a multi-ferroic film having both a ferromagnetic property and a ferroelectric property, as a constituent material capable of fundamentally enhancing the characteristic of the ME effect element, however, such a constituent material as described hardly exists in the current state of the art.

It is therefore an object of the invention to provide a spin-wave waveguide high in performance, operable at room temperature, capable of substituting for an ME effect element, and exciting a spin wave, and writing, and an operation circuit using the spin-wave waveguide, compatible with an existing synchronous operation circuit.

To that end, in accordance with one aspect of the invention, there is provided a spin-wave waveguide comprising a ferromagnetic thin film resembling a wire in shape, and a part of the ferromagnetic thin film, large in film thickness, apart of the ferromagnetic thin film, small in film thickness, and apart of the ferromagnetic thin film, large in film thickness, the parts being formed in this order on the ferromagnetic thin film, so as to be arranged in a direction where the wire is extended. An insulating film, and an electrode film are stacked in this order in the part of the ferromagnetic thin film, large in film thickness, and magnetic anisotropy of the part of the ferromagnetic thin film, large in film thickness, is parallel with a film surface while magnetic anisotropy of the part of the ferromagnetic thin film, small in film thickness, is perpendicular to the film surface. Further, the ferromagnetic thin film may be comprised of Co, and Fe, or an alloy of Co, and Fe, or a metal comprised of Co, and Fe, or the alloy of Co, and Fe, containing B.

In accordance with another aspect of the invention, there is provided a spin-wave waveguide comprising a first ferromagnetic thin film resembling a wire in shape, and a second ferromagnetic thin film differing from the first ferromagnetic thin film, and a region where the second ferromagnetic thin film, an insulating film, and an electrode film are stacked in this order is provided on the first ferromagnetic thin film, further a portion of the first ferromagnetic thin film, provided with a stacked film, and a portion of the first ferromagnetic thin film, not provided with the stacked film, are formed in this order in a direction where the wire is extended. Further, magnetic anisotropy of the first ferromagnetic thin film is perpendicular to a film surface while magnetic anisotropy of a portion of the second ferromagnetic thin film, large in film thickness, is oriented in the longitudinal direction of the film surface.

Further, the second ferromagnetic thin film may be comprised of Co, and Fe, or an alloy made of Co, and Fe, or a metal comprised of Co, and Fe, or the alloy of Co, and Fe, containing B. Still further, the first ferromagnetic thin film may be made up of an alloy containing any element selected from the group consisting of Co, Fe, and Ni, or a plurality of elements selected therefrom, together with any element selected from the group consisting of Pt, and Pd, an alternate-stacked film comprised of any element selected from the group consisting of Co, Fe, and Ni, or a plurality of elements selected therefrom, together with any element selected from the group consisting of Pt, and Pd, or an alternate-stacked film comprised of Co, or Fe, or an alloy containing Co, or Fe, together with Ni, and so forth.

Furthermore, the insulating film may be an MgO film in the spin-wave waveguide. Otherwise, the insulating film may be made up of an oxide, a nitride, and an oxynitride, containing at least one element selected from the group consisting of Al, Zn, Ti, Zr, Ni, SI, and Fe. Or, a metal film may be inserted between the first ferromagnetic thin film and the second ferromagnetic thin film, and magnetization of the first ferromagnetic thin film may be magnetically coupled to magnetization of the second ferromagnetic thin film by the agency of a bonding force with exchange interaction via the metal film inserted.

Otherwise, in the spin-wave waveguide, the electrode film stacked on the part of the ferromagnetic thin film, large in film thickness, formed at one end of the spin-wave waveguide, may be made of a non-magnetic metal. Further, the electrode film stacked on the part of the ferromagnetic thin film, small in film thickness, formed at one end of the spin-wave waveguide, may be a ferromagnetic film.

In accordance to still another aspect of the invention, there is provided a spin-wave operation circuit comprising the spin-wave waveguide, and a means for transmitting a signal to the electrode film formed on the spin-wave waveguide, and an electrode at the one end of the spin-wave waveguide is used for signal-writing, or for excitation of a spin wave propagating through the ferromagnetic thin film resembling a wire in shape, and an electrode at the other end of the spin-wave waveguide is used for signal-reading, while other electrodes of the spin-wave waveguide are used for the signal-writing, the excitation of the spin wave propagating through the ferromagnetic thin film resembling a wire in shape.

Yet further, a plurality of the spin-wave waveguides may intersect each other in a region where the signal-writing, the excitation of the spin wave, and the signal-reading are executed. Furthermore, if a relationship between a wavelength ($\lambda$) of the spin wave and a width (w) of the spin-wave waveguide, that is, the ferromagnetic thin film resembling a wire in shape is shown as $\lambda<w$ in the spin wave operation circuit, a plurality of the spin-wave waveguides may intersect each other in a region other than a region where the signal-writing, the excitation of the spin wave, and the signal-reading are executed.

Further, a voltage larger than a predetermined threshold voltage, having a predetermined pulse width, is applied to the electrode in the spin wave operation circuit, and information is thereby written to a part of the ferromagnetic thin film. Or, a voltage lower than a predetermined threshold voltage, having a predetermined pulse width, is applied to an electrode in a spin wave operation circuit, and a spin wave is caused to undergo excitation within a ferromagnetic thin film in a spin wave operation circuit.

Thus, the use of the present invention can provide a spin-wave waveguide ultra-low power consumption, compatible with an existing synchronous operation circuit, and an operation circuit using the spin-wave waveguide.

DETAILED DESCRIPTION OF THE PREFERRED EMBODIMENTS

There are described hereinafter various embodiments of the invention with reference to the accompanied drawings.

First Embodiment

Figure 3:
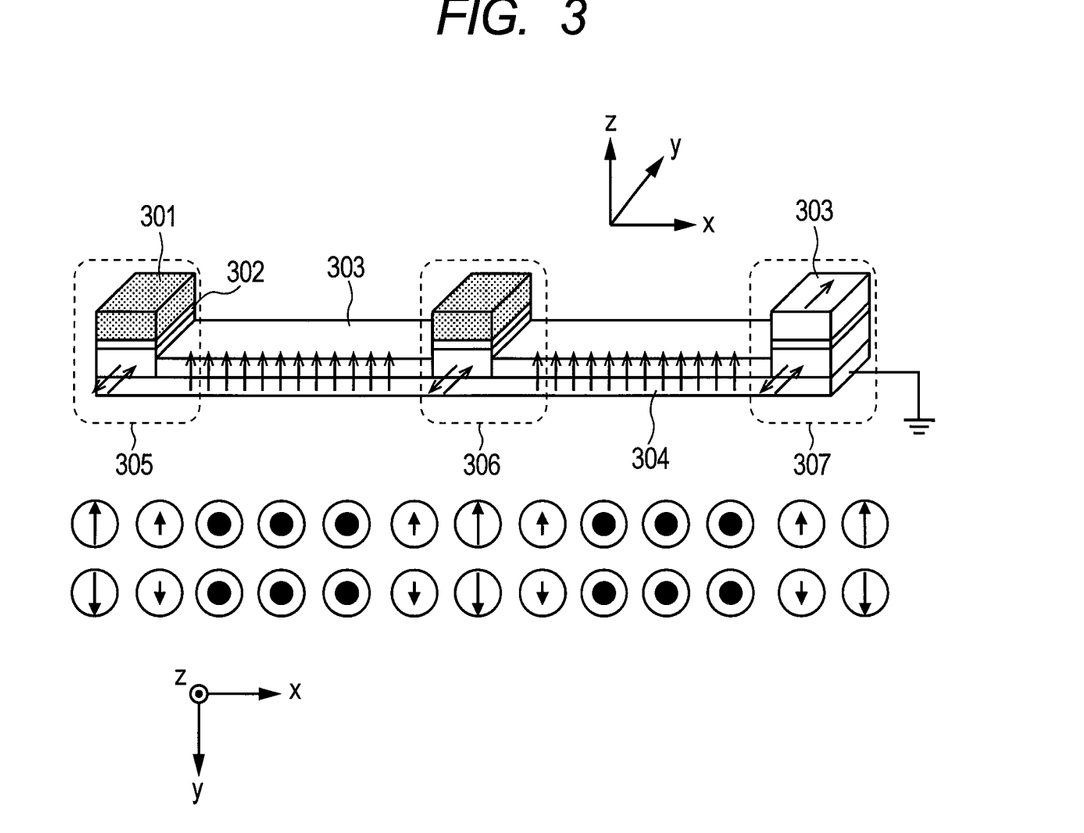
FIG. 3 is a view showing a first embodiment of a spin-wave waveguide according to the invention.

FIG. 3 is a view showing a first embodiment of a spin-wave waveguide according to the invention.

Reference numeral 301 denotes an electrode, 302 an insulating film, 303 a ferromagnetic filmmaking up a spin-wave waveguide, and 304 a substrate film. Reference numeral 305 denotes an information input part, 306 a primary information-recording part, and 307 an information regeneration part. The ferromagnetic film 303 is substituted for the electrode 301 at 307, and 307 serves as a so-called ferromagnetic tunneling junction (MTJ).

Further, description is given hereinafter with reference to an xyz coordinate system shown in FIG. 3. With the present invention, a direction vertical to the film surface indicates the z-axis direction, and a direction parallel with the film surface indicates the direction within the x-y plane. This definition is exactly identical to that given with reference to FIGS. 1, 2, respectively.

Directions of magnetization in respective regions are schematically shown in a lower part of FIG. 3. In the region 305, the easy axis of magnetization is oriented in the longitudinal direction, however, the region 305 is linked with the waveguide part 303 where the direction of the easy axis of magnetization is perpendicular to the film surface via a constituent material identical thereto, so that a magnetization direction in the region 305 is oriented between the longitudinal direction and the perpendicular direction without being oriented fully in the longitudinal direction. In the waveguide part 303 wire-like (linear) in shape, a magnetization direction is oriented in the direction perpendicular to the film surface. In the region 306 for provisionally recording information, a magnetization direction is identical to that in the region 305. In a region on the right side of 306, a magnetization direction is oriented in the direction perpendicular to the film surface.

In a ferromagnetic film of the lower part of the region 307, a magnetization direction is identical to that in the regions 305, 306, respectively. In a ferromagnetic film 303 of the upper part of the region 307, a magnetization direction is oriented fully in the longitudinal direction.

Figure 4:
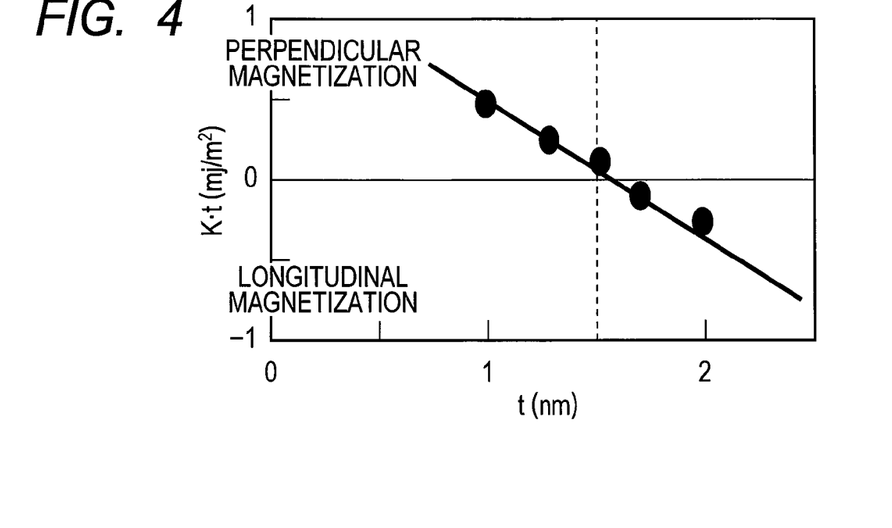
FIG. 4 is a view showing a relationship between a thickness of a magnetic film used in the first embodiment of the present invention and magnetic anisotropy thereof.

The reason why both the longitudinal magnetization and the perpendicular magnetization can be realized with the use of the same material of 303, in the present embodiment, is described hereinafter with reference to FIG. 4. FIG. 4 is a view showing a relationship between a CoFeB film thickness t of a CoFeB film receiving attention at present, as a MTJ material that realizes a high tunneling magnetic resistance (TMR) ratio, and perpendicular anisotropy energy K of the CoFeB film. In {Nature Materials, Vol. 9, pp. 721-724 (2010)}, it is shown that in the case of a film thickness having a perpendicular anisotropy energy density greater than zero, a magnetization direction is oriented in the perpendicular direction, and if the perpendicular anisotropy energy density becomes smaller than zero, the magnetization direction is oriented in the longitudinal direction. With the present embodiment, CoFeB is assumed to have a composition of $Co_{20}Fe_{60}B_{20}$. However, the composition is not limited thereto.

With the present embodiment, the magnetization direction have undergone a change from the perpendicular direction to the longitudinal direction if t=1.6 nm. A critical film-thickness at which the magnetization of the ferromagnetic film is switched over from the perpendicular direction to the longitudinal direction varies according to the composition of the CoFeB film, a constituent material of the substrate film of the lower part, and so forth. A composition ratio Co:Fe of CoFeB is preferably from 50:50 to 0:100 in order to obtain a relatively large critical film-thickness. Further, for the substrate film, use is preferably made of an alloy based on Ta. With the present embodiment, the respective CoFeB films (longitudinally magnetized films) of the regions 305, 306, 307 are set to 1.7 nm in thickness on the basis of the result of measurement, and CoFeB layers to be perpendicularly magnetized, other than the CoFeB films, are set to 1.3 nm in thickness. When saturation magnetization Ms of the CoFeB film was measured by use of a vibrating-sample magnetometer (VSM), a value thereof was found at 1.6 T.

The respective CoFeB films of the regions 305, 306, 307 are intrinsically the longitudinally magnetized films, however, because the CoFeB film of the region, other than the respective regions 305, 306, and 307 is perpendicularly magnetized, as shown in FIG. 3, the magnetization direction thereof is not fully oriented in the longitudinal direction. With the present embodiment, the magnetization direction in the respective CoFeB films of the regions 305, 306, and 307 was found to form an angle of about 45 degrees from the film surface when an external magnetic field was not applied. This angle can be changed by adjusting the thicknesses of the respective CoFeB films of the regions 305, 306, 307, and the thickness of the CoFeB film of the region, other than the regions 305, 306, and 307.

Further, with the present embodiment, the spin-wave waveguide wire-like (linear) in shape was set to 100 nm in width, and for the insulating film 302, use was made of MgO. The type of the insulating film is not limited to an MgO film, and for the insulating film, use can be made of an oxide, a nitride, and an oxynitride, containing at least one element selected from the group consisting of, for example, Al, Zn, Ti, Zr, Ni, Si, and Fe. With the present embodiment, Al was used as a constituent material of the electrode 301; however, a metal small in resistivity, other than Al, such as Cu, Au, Ag, or an alloy thereof, is preferably used. The electrode 301 and the insulating film 302 each were set to 50 nm in size in a depth-direction.

A method for information recording, and a method for information transmission, in the present the spin-wave waveguide, are each described hereinafter in detail.

Figure 5A:
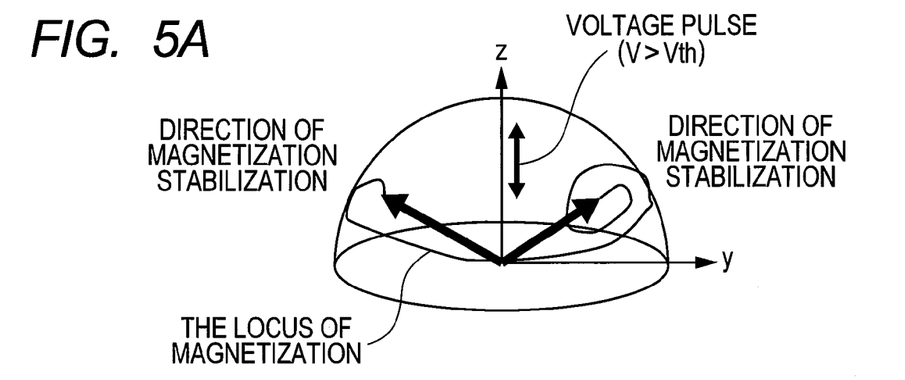
FIG. 5A and FIG. 5B are views showing information writing and a spin-wave excitation method according to the first embodiment of the present invention.
Figure 5B:
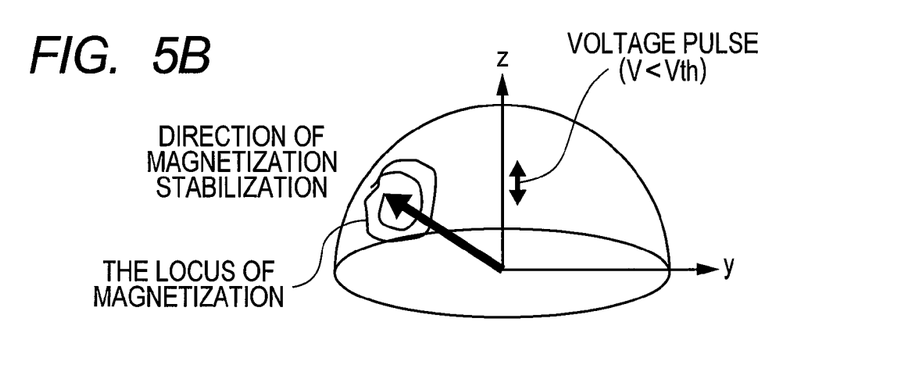

The information recording is executed by use of an electric field pulse in the region 305. Upon application of an electric field pulse from the CoFeB film 303 that is set positive in polarity to the electrode 301, an electron state in the vicinity of an interface between the CoFeB film 303 and the MgO film 302 undergoes a change, whereupon perpendicular magnetic anisotropy in the vicinity of the interface will increase. As a result, magnetization starts precession, as shown in FIG. 5A. If an applied voltage is larger than a threshold voltage Vth, an amplitude of the precession of the magnetization will increase, whereupon the magnetization starts precession centering around the z-axis. If a width τ of a voltage pulse is approximately T/2 on the assumption that a period of the precession is defined as T, the magnetization undergoes gradual attenuation at a point a little short of around a stabilization point after the voltage pulse is cut off to finally fall to the stabilization point, thereby coming to a rest, as shown in FIG. 5B.

If τ=T, the magnetization comes to a rest at the original stabilization point. Thus, if τ=T/2*(n−1) (n is a natural number), transition of magnetization occurs, and if τ=nT, the transition of magnetization does not occur. In the case of the present embodiment, Vth was at about 0.4 V, and T=300 ps. From the standpoint of a high-speed operation, recording is preferably executed at τ=150 ps, however, if a peripheral circuit cannot be speeded up to such an extent as that, it need only be sufficient to use a pulse width of a high-order period such as τ=450 ps, 750 ps, and so forth. In an actual circuit operation, magnetization in a −y-direction (information 0), or magnetization in a +y-direction (information 1) is recorded in the CoFeB film of the region 303 during a preceding recording operation. If the same information as preceding information need be recorded, no voltage is applied. If the preceding information need be rewritten, a pulse voltage at τ=T/2*(n−1) is to be applied.

For information transmission, a spin wave is used. In this case, a pulse voltage smaller in value than the Vth, having τ<T, is applied. In order to switch over between two stable magnetization directions described as above, there is the need for supplying magnetization with kinetic energy in excess of an energy barrier ΔE between both the stable magnetizations. However, if V<Vth, the kinetic energy is insufficient, so that switching of the magnetization does not occur, and precession proceeds around the stabilization point of the magnetization. This precession, as a spin wave, propagates from the region 305 to the spin-wave waveguide, whereupon the spin wave overwrites the information 0, 1 on the CoFeB film in the region 306.

The principle behind writing by a spin wave is further described detail with reference to FIG. 11. Coordinate axes in FIG. 11 are identical in definition to those of FIG. 3. Suppose the case where the information 1 is recorded in an information input part as shown in FIG. 11A, that is, the case where magnetization is oriented in the +y-direction. Because a distance between an information input part 1101 and an information output part 1103 is equal to a wavelength λ of the spin wave, the spin wave 1104 excited by an electric field will have an amplitude oriented in the +y-direction in the information output part after the elapse of time t=λ/v (v is a speed of the spin wave) from the excitation of the spin wave. This information, as it is, is recorded in the information output part.

Figure 11A:
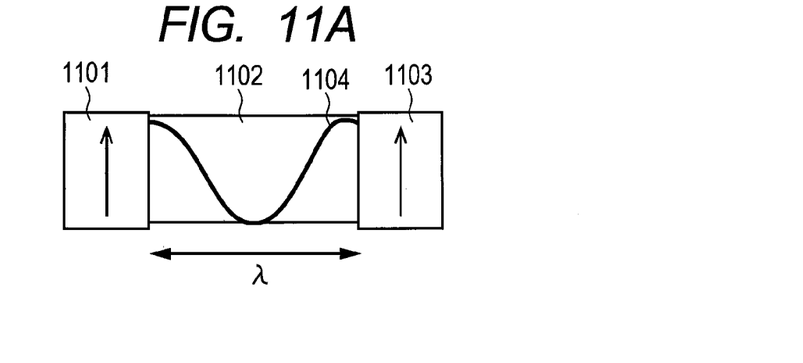
FIGS. 11A, 11B, 11C and 11D are views for describing the principle behind writing by a spin wave.
Figure 11B:
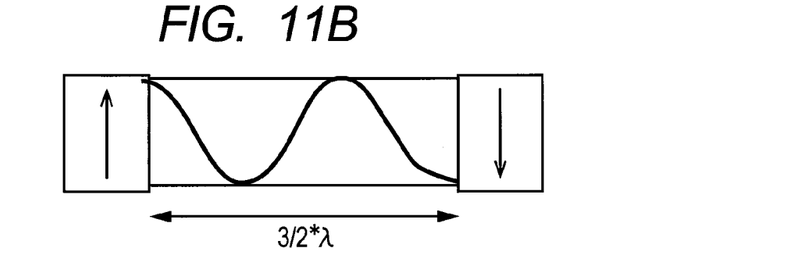
Figure 11C:
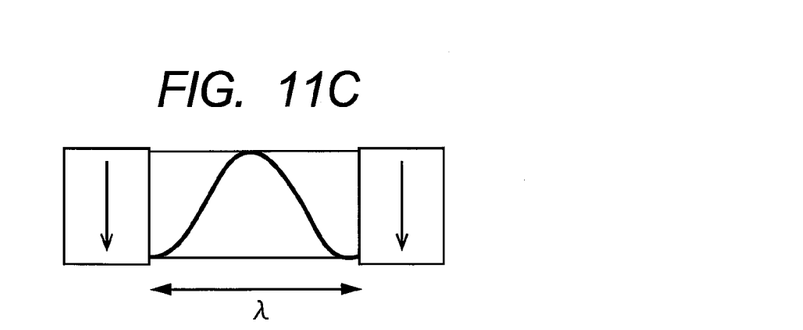

On the other hand, in the case where the distance between the information input part 1101 and the information output part 1103 is (n+½) (n is a natural number) times as long as the wavelength λ of the spin wave, as shown in FIG. 11(b), the spin wave will have an amplitude oriented in the −y-direction after the elapse of time t, and this information, as it is, is recorded in the information output part. In the case where the distance between the information input part 1101 and the information output part 1103 is equal to the wavelength λ of the spin wave, and the information 0, that is, the magnetization in the −y-direction is recorded in the information input part, as shown in FIG. 11C, the spin wave will have an amplitude oriented in the −y-direction after the elapse of time t, and this information, as it is, is recorded in the information output part.

Figure 11D:
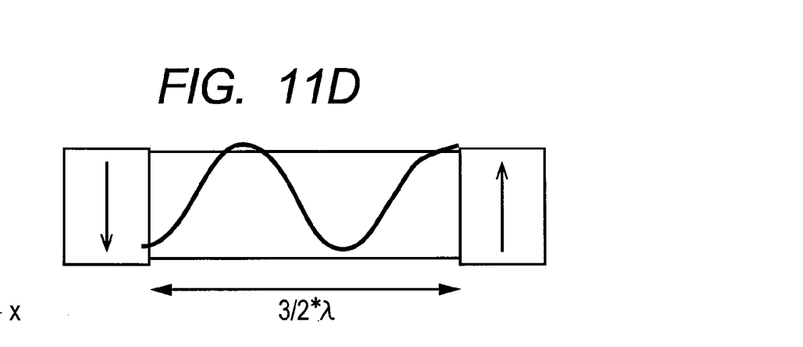

Further, in the case where the distance between the information input part 1101 and the information output part 1103 is (n+½) times as long as the wavelength λ of the spin wave, and the information 0, that is, the magnetization in the −y-direction is recorded in the information input part as shown in FIG. 11(d), the spin wave will have an amplitude oriented in the +y-direction after the elapse of time t, and this information, as it is, is recorded in the information output part.

While the fundamental principle is described as above, an experiment was further conducted by varying information written to the region 305 and a distance between the region 305 and the region 306 in order to measure which of the information 0 and the information 1 is written to the region 306. The result of the experiment is summarized in Table 1 (n is a natural number).

TABLE 1

| Information recorded in the region 305 | Distance L between the regions 305 and 306 (λ = spin-wave wavelength) | Information recorded in the region 306 |
|---|---|---|
| 0 | (n − 0.1) λ < L < (n + 0.4) λ | 0 |
| 0 | (n + 0.4) λ < L < (n + 0.9) λ | 1 |
| 1 | (n − 0.1) λ < L < (n + 0.4) λ | 1 |
| 1 | (n + 0.4) λ < L < (n + 0.9) λ | 0 |

It is evident from the result that if a distance L between the regions 305, 306 is (n−0.1) λ<L<(n+0.4) λ, the information in the region 305 is identical to that in the region 306, thereby showing that the pin-wave waveguide acts as a buffer. On the other hand, if the distance L between the regions 305, 306 is (n+0.4) λ<L<(n+0.4) λ, information opposite from the information in the region 305 is written to the region 306, so that the pin-wave waveguide acts as an inverter.

The information transmission and computation processing from the primary information-recording region 306 to the reading region 307 are executed by the exactly same procedure as described above. More specifically, the pulse voltage at V<Vth, having τ<T, is applied to the electrode of the region 306 to thereby excite the spin wave, whereupon the spin wave propagates through the spin-wave waveguide, and information is finally written to the region 307. Finally, a minute current is caused to flow between the CoFeB film in the upper part of the region 307 and the CoFeB film in the lower part thereof, and the information (0, 1) recorded in the region 307 is read out by the agency of the TMR effect.

Figure 6A:
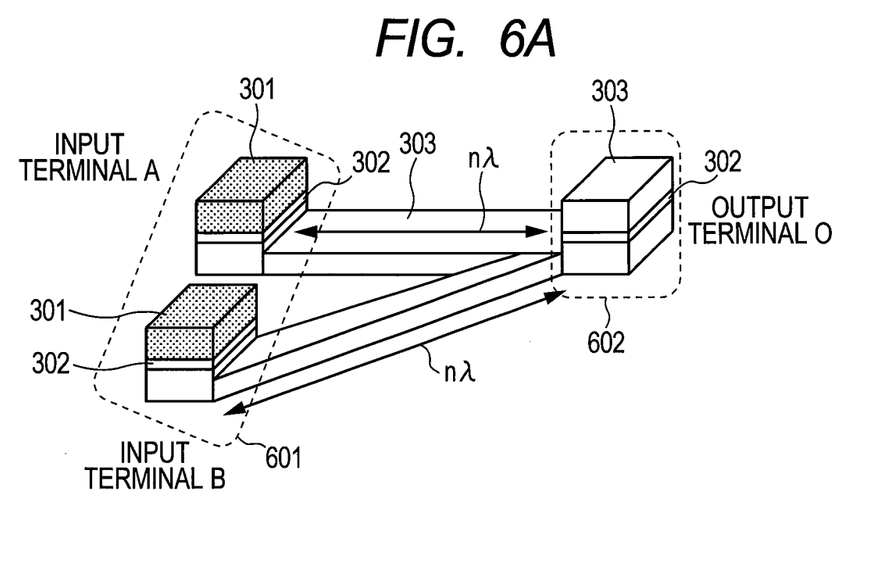
FIG. 6A and FIG. 6B are views showing basic logic elements of a spin wave operation circuit according to the invention.
Figure 6B:
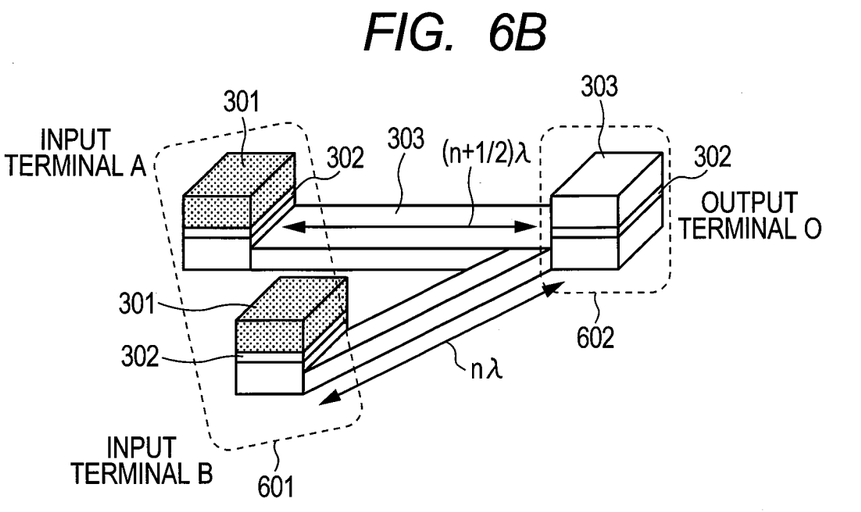

FIGS. 6A and 6B show a configuration example of other fundamental AND logic, OR logic, and NAND logic gates using the spin-wave waveguide according to the present invention. FIG. 6A shows an AND logic. Reference numeral 601 denotes two terminals which input information, and 602 denotes a terminal which outputs information. A distance between a region 601 and a region 602 is n-times as long as the wavelength λ of the spin wave, and further, the information 0 is kept recorded in the region 602 in advance. A truth table is shown in Table 2.

TABLE 2

| Information of input terminal A | Information of input terminal B | Information of output terminal O |
|---|---|---|
| 0 | 0 | 0 |
| 0 | 1 | 0 |
| 1 | 0 | 0 |
| 1 | 1 | 1 |

In FIG. 6A, since two waveguides are equal in length to each other, if an input terminal A is identical in phase (that is, information as recorded) to an input terminal B, a spin wave excited by the input terminal A, and a spin wave excited by the input terminal B will reinforce each other before interfering with each other, so that the information 0 is recorded in the case where original input information is (0, 0) while the information 1 is recorded in the case where original input information is (1, 1).

On the other hand, if the input terminal A is not identical in phase (that is, the information as recorded) to the input terminal B, the spin wave excited by the input terminal A, and the spin wave excited by the input terminal B will weaken each other before interfering with each other, so that the information is not overwritten, and either of the information pieces will remain in as-recorded state. Thus, the truth table shown in Table 2 is realized. OR logic can be realized by keeping the information 1 to be pre-recorded in the region 602 in a waveguide structure shown in FIG. 6A.

FIG. 6B shows an example in which NAND logic is realized. In FIG. 6B, a distance between an input terminal A and an output terminal O is (n+½) times as long as the wavelength λ of the spin wave, and a distance between an input terminal B and the output terminal O is n-times as long as the wavelength λ of the spin wave. Further, the information 1 is kept pre-recorded in the region 602. A truth table is shown in Table 3.

TABLE 3

| Information of input terminal A | Information of input terminal B | Information of output terminal O |
|---|---|---|
| 0 | 0 | 1 |
| 0 | 1 | 1 |
| 1 | 0 | 1 |
| 1 | 1 | 0 |

In FIG. 6(b), two waveguides differ in length from each other by a half wavelength of the spin wave, and if a spin wave is excited at the input terminals A, B at the same timing, the spin wave excited at the input terminal A is inevitably delayed in reaching the output terminal O. In the case where the recorded information is (0, 0), the spin wave of the input terminal B first reaches the output terminal O to record the information 0, and subsequently, the spin wave of the input terminal A reaches the output terminal O, however, the phase thereof is deviated from the recorded information of the input terminal A by π, so that the information 1 is overwritten to the output terminal O. In the case where the recorded information is (0, 1), the spin wave excited at the input terminal B first reaches the output terminal O to record the information 1, and subsequently, the spin wave excited at the input terminal A reaches there, whereupon the information 1 with a phase deviated by π from the information of the input terminal is overwritten to the output terminal.

In the case where the recorded information is (1, 0), the spin wave excited at the input terminal B first reaches the output terminal O to record the information 0, and subsequently, the spin wave excited at the input terminal A reaches there, however, the phase thereof is deviated by IC from the recorded information of the input terminal A, so that the information 1 is overwritten to the output terminal O. In the case where the recorded information is (1, 1), the spin wave excited at the input terminal B first reaches the output terminal O to record the information 1, and subsequently, the spin wave excited at the input terminal A reaches there, however, the phase thereof is deviated by π from the recorded information of the input terminal A, so that the information 0 is overwritten to the output terminal O.

Thus, NAND logic is realized. Since NAND logic elements are universal circuits for use in realizing all logic operation circuits, it is evident from the description as above that all the logic operation circuits can be realized by use of the spin-wave waveguide according to the invention.

Next, a method for realizing a large scale logic operation circuit making use of the spin-wave waveguide according to the invention is described hereinafter by taking an example of a full adder. The full adder is the most fundamental functional unit for sequentially adding N-bit binary digits A (taking values A1, A2, . . . , AN in increasing order of bits), and N-bit binary digits B (taking values B1, B2, . . . , BN in increasing order of bits), from respective low-order bits, thereby digitally calculating the sum of the two binary digits. A carry output at the time of executing addition of the respective bits is recorded in a carry Ci (i=1, 2, . . . , N) to be used at the time of calculation of bits higher in order by one. The result of final calculation is expressed by (N+1)-bit binary digits such as (01, 02, . . . , 0N, CN in increasing order of bits.

A layout method for realizing the adder described as above by use of the spin-wave waveguide can be divided into two cases according to a relationship between the wavelength λ of the spin wave and a width w of the spin-wave waveguide. If two spin waves intersect each other when λ is greater than w, leakage of a spin wave, from one waveguide to the other, will occur in a region of intersection, that is, a so-called crosstalk will occur. In consequence, noise occurs to the result of an operation, which is not preferable from the viewpoint of an operation in the operation circuit. Accordingly, in the case of λ>w, intersection of the spin-wave waveguides, with each other, is not permissible in terms of a layout. On the other hand, in the case of λ<w, the leakage of the spin wave, from one waveguide to the other will not occur even if the spin-wave waveguides intersect each other. Accordingly, in the case of λ<w, a layout whereby the spin-wave waveguides intersect each other is permissible.

Figure 7:
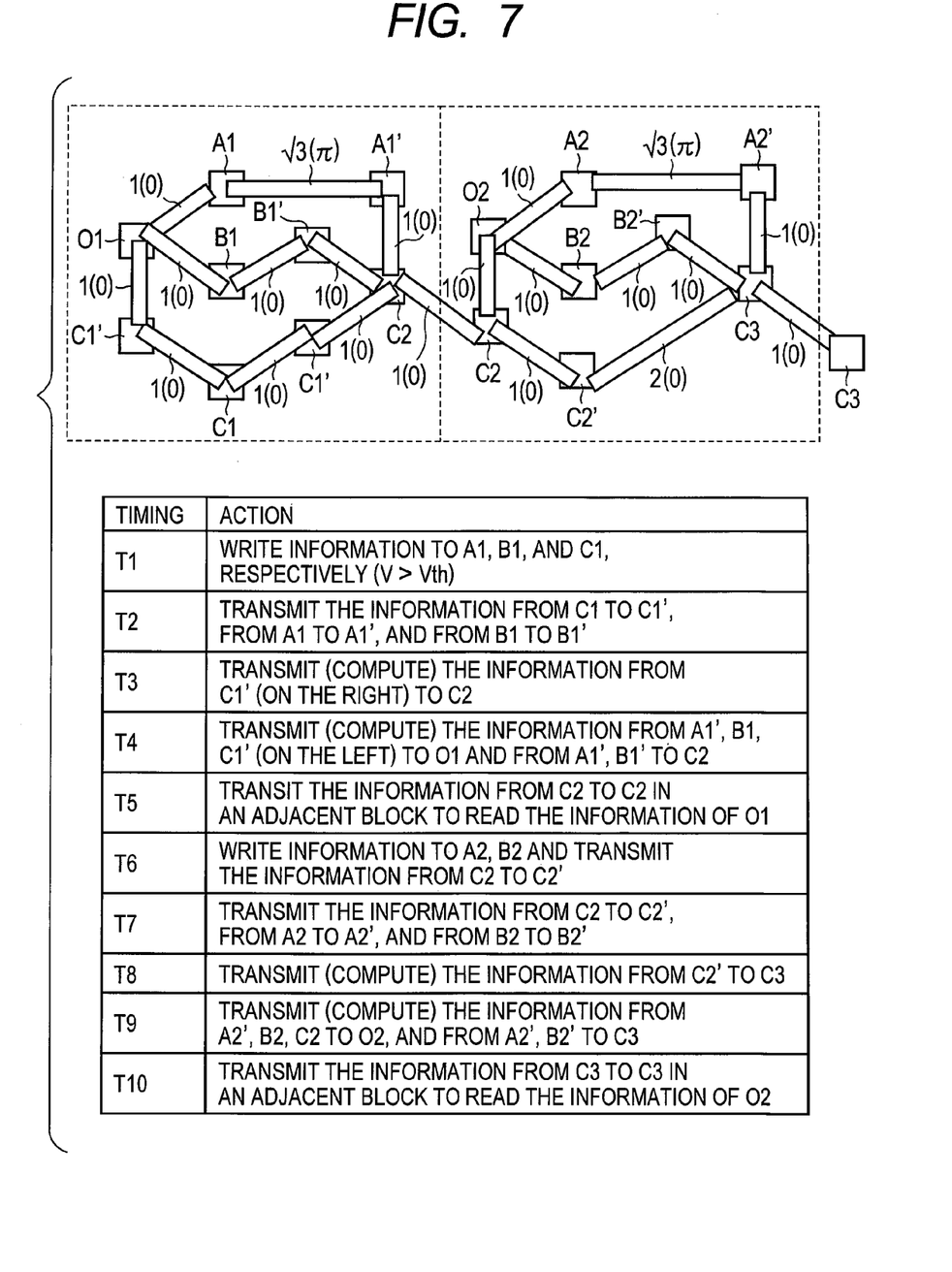
FIG. 7 is a view showing one example of a full adder using the spin-wave waveguide according to the invention.

FIG. 7 is a view showing one example of a layout of the full adder in the case where coupling of the spin-wave waveguides, with each other, is not permissible (λ>w). A square part indicates the input terminal, and the primary information-recording part, respectively, and a rectangle connecting the square parts with each other indicates the spin-wave waveguide. Now, m (0, or π) that is overwritten to the spin-wave waveguide indicates which spin-wave waveguide has a length corresponding to what-hold wavelength of the spin wave. With the present embodiment, each portion of the figure, surrounded by a broken line, is an area where 1-bit calculation is executed. A1, B1, in the portion of the figure, surrounded by the broken line, on the left-hand side, are each an input terminal for receiving a binary digit value of a bit at the lowest order, while C1 is an input terminal for receiving a binary digit value of the lowest carry.

An operation of the present operation circuit is described hereinafter. The circuit as a whole is supplied with a clock voltage for giving the same timing. An interval between the clock voltages is selectable according to a velocity of the spin wave, and if a distance from all the input terminals to the primary information-recording part, and a distance from all the input terminals to the output terminal are $\lambda$, and $\sqrt{3}\lambda$, respectively, with, for example, $\lambda=100$ (nm), a group velocity of the spin wave will become $1\times10^5$ (m/s), and therefore, a clock interval is set to $10^{-6}$ (m)/$10^5$ (m/s)*2=$2\times10^{-9}$ (s), that is, around 0.2 ns, which is converted into frequency at 5 GHz, indicating that a high-speed operation action is enabled.

If this is applied to the example shown in FIG. 7, a difference between timing T1 and timing T2, . . . , timing T9 and timing T10, will become 0.2 ns. The operation in FIG. 7 is hereinafter described on the basis of a table inserted in FIG. 7. First, information on least significant bit is recorded in A1, B1, and C1, respectively, at the timing T1. Next, the information is transmitted from A1 to A1', from B1 to B1', and from C1 to C1' by means of the spin wave at the timing T2. In information transmission of B1⇒B1', and C1⇒C1', information 0 or 1, as it is, is transmitted, however, in information transmission from A1 to A1', the information 0 or 1 is reversed before being transmitted.

Then, information is transmitted by means of the spin wave from C1' (one on the right side) to C2 at the timing T3. C1 information, as it is, is recorded in C2 at this stage. Next, the information is transmitted from A1 to O1, from B1 to O1, and from C1' (on the right) to O1, from A1' to C2, and from B1' to C2 by means of the spin wave at timing T4. The information recorded in O1 is information pieces recorded in A1, B1, and C1, respectively, and if the information includes many "1s", "1" is recorded, while if the information includes many "0s", "0" is recorded. On the other hand, in information transmission from A1' to C2 and from B1' to C2 if information pieces of A1', and B1', respectively, are (0, 0), "0" is recorded, and if the information pieces are (1, 1), "1" is recorded, while if the information pieces are (1, 0 or 0.1), information immediately before C2 is held. Thus, a truth table of the full adder shown in Table 4 is realized.

TABLE 4

| A1 | B1 | C1 | C2 | O1 |
|----|----|----|----|----|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

Next, the information of C2 in the left block is transmitted to C2 in the block adjacent thereto by means of the spin wave at timing T5, thereby reading the information of O1.

Thereafter, by repeating respective actions shown in the table of FIG. 7 at timing T6 through T10, the 2-bit-th digit from the least significant bit can be added exactly in the same way. If this operation is repeated N times thereafter, it is possible to obtain a calculation result of (N+1) bits such as (O1, O2, . . . , ON, CN).

Figure 8:
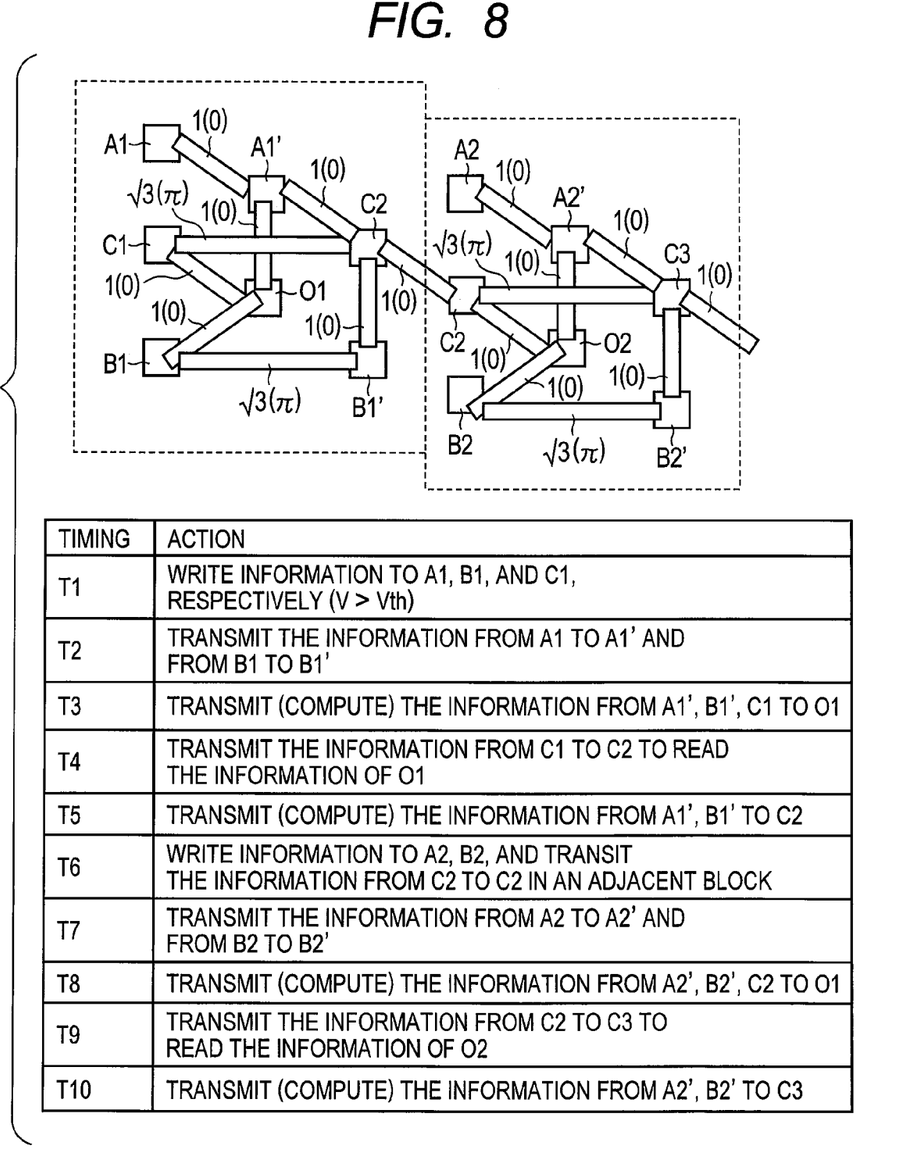
FIG. 8 is a view showing another example of a full adder using the spin-wave waveguide according to the invention.

FIG. 8 is a view showing one example of a layout of the full adder in the case where coupling of the spin-wave waveguides, with each other, is permissible ($\lambda<w$). As is the case with FIG. 7, a square part indicates the input terminal, and the primary information-recording part, respectively, and a rectangle connecting the square parts with each other indicates the spin-wave waveguide. Herein, m (0, or $\pi$) that is overwritten to the spin-wave waveguide indicates which spin-wave waveguide has a length corresponding to what-hold wavelength of the spin wave. With the present embodiment, each portion of the figure, surrounded by a broken line, is an area where 1-bit calculation is executed. A1, B1, in the portion of the figure, surrounded by the broken line, on the left-hand side, are each an input terminal for receiving a binary digit value of least significant bit, while C1 is an input terminal for receiving a binary digit value of least significant carry. The present operation in detail is as shown in a table in the lower part of FIG. 8, being basically the same as in the case of FIG. 7.

Figure 9:
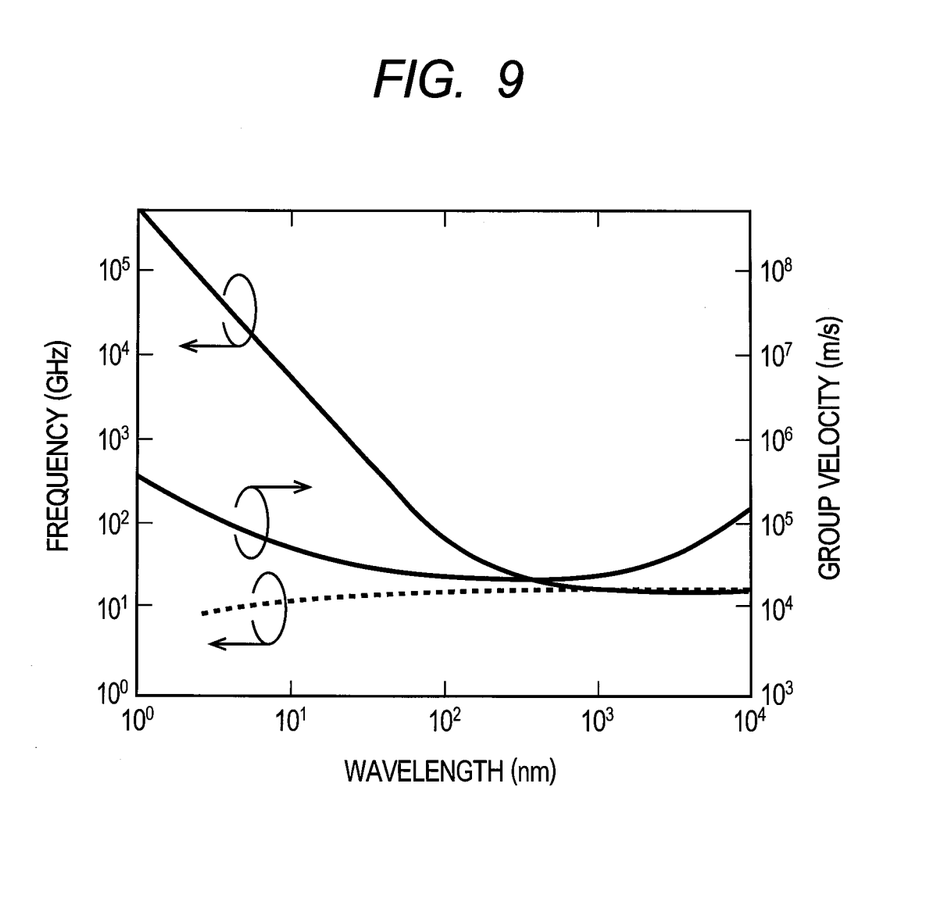
FIG. 9 is view showing a characteristic of the spin wave propagating through the spin-wave waveguide according to the invention.

FIG. 9 is view showing a characteristic of the spin wave propagating through the spin-wave waveguide according to the invention. If the wavelength $\lambda$ of the spin wave is longer than 1 μm, the frequency of the spin wave becomes substantially constant. Accordingly, as the wavelength becomes longer, so a velocity (group velocity) at which the spin wave propagates through the waveguide increases little by little. If the wavelength of the spin wave becomes shorter than 1 μm, two modes of waves show up, including a surface spin wave indicated by a broken line in FIG. 9, and a switched connection spin wave indicated by a solid line in FIG. 9. In the case of the latter, as the wavelength $\lambda$ of the spin wave becomes shorter, so an increase in frequency occurs, and enhancement in group velocity as well continues. In order to reduce an area of the spin wave operation circuit, it is effective to reduce the wavelength of the spin wave, rendering it possible to achieve enhancement in the velocity of the spin wave, that is, reduction in delay time. Therefore, reduction in the wavelength of the spin wave represents a means for significantly enhancing the performance of the operation circuit, including reduction in delay, and reduction in circuit area. Meanwhile, it can be said that if material as well as structure of a spin-wave waveguide is properly selected, this will enable a desirable operation circuit to be realized.

Second Embodiment

Figure 10:
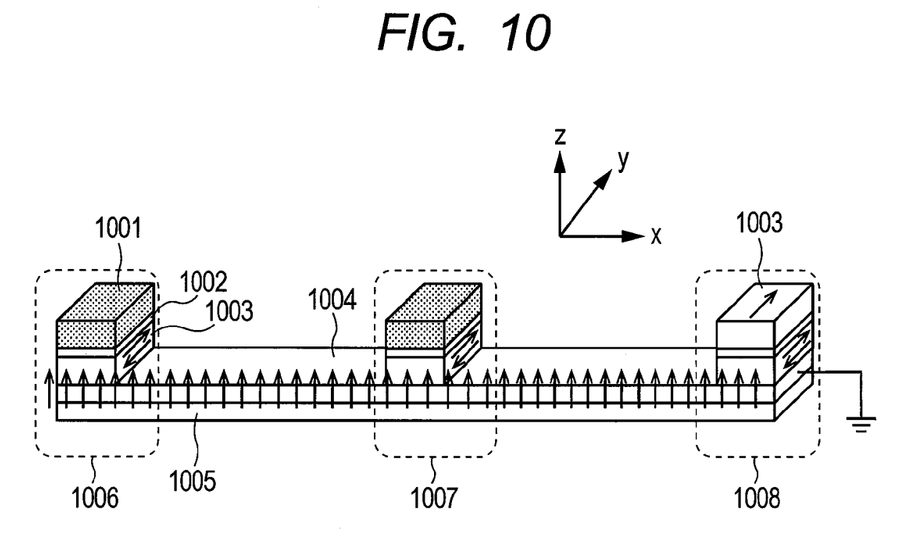
FIG. 10 is a schematic diagram showing a second embodiment of a spin-wave waveguide according to the invention.

FIG. 10 is a schematic diagram showing a second embodiment of a spin-wave waveguide according to the invention. Reference numeral 1001 denotes an electrode, 1002 an insulating film, 1003 a ferromagnetic film having magnetic anisotropy within a film surface, 1004 a ferromagnetic film making up a spin-wave waveguide, and 1005 a substrate film. Reference numeral 1006 denotes an information input part, 1007 a primary information-recording part, and 1008 an information regeneration part. At 1008, the ferromagnetic film 1003 is substituted for the electrode 1001, and the primary information-recording part 1007 serves as the so-called ferromagnetic tunneling junction (MTJ).

In FIG. 10, a region 1006 is linked with the waveguide part 1004 where a direction of the easy axis of magnetization is perpendicular to the film surface via the same constituent material although the easy axis of magnetization of the ferromagnetic film 1003 is oriented in the longitudinal direction, so that a magnetization direction in the region 1006 is oriented between the longitudinal direction and the perpendicular direction without being fully oriented in the longitudinal direction. In the spin-wave waveguide part 1004, the magnetization direction is oriented in the perpendicular direction. In a region 1007 for provisionally recording information, a magnetization direction is identical to that in the region 1006. In a region on the right side of 1006, a magnetization direction is oriented in the perpendicular direction. In a ferromagnetic film in the lower part of a region 1008, a magnetization direction is identical to that in the regions 1006, 1007, respectively. A magnetization direction of the ferromagnetic film 1003 in the upper part of the region 1008 is fully oriented in the longitudinal direction.

Now, constituent materials for use in the present embodiment are described in detail. For a constituent material of the spin-wave waveguide part 1004, use is made of an alloy containing any element selected from the group consisting of Co, Fe, and Ni, or a plurality of elements selected therefrom, and any element selected from the group consisting of Pt, and Pd, an alternate-stacked film comprised of any element selected from the group consisting of Co, Fe, and Ni, or a plurality of elements selected therefrom, Pt, and Pd, or an alternate-stacked film comprised of Co, or Fe, or an alloy containing Co, or Fe, and Ni. For the ferromagnetic film having magnetic anisotropy in the longitudinal direction, use is made of, for example, the CoFeB film presently receiving attention, as the MTJ material that realizes a high tunneling magnetic resistance (TMR) ratio, or an alloy comprised of Co, and Fe, without containing B. In this case, the CoFeB film, or the CoFe film need to have a thickness larger than the critical film-thickness such that the magnetic anisotropy of the ferromagnetic film is oriented in the longitudinal direction, as described in the case of the first embodiment.

Further, for the insulating film 1002, use was made of MgO. The type of the insulating film is not limited to the MgO film, and for the insulating film, use can be made of an oxide, a nitride, and an oxynitride, containing at least one element selected from the group consisting of, for example, Al, Zn, Ti, Zr, Ni, SI, and Fe. With the present embodiment, Al was used as the constituent material of the electrode 1001; however, a metal small in resistivity, other than Al, such as Cu, Au, Ag, or an alloy thereof, is preferably used.

Otherwise, by inserting a thin metal film (not shown) made of Ru, Ir, and so forth between the ferromagnetic film 1003 and the perpendicularly magnetized film 1004, the ferromagnetic film 1003 can be coupled to the perpendicularly magnetized film 1004 by the agency of a bonding force with exchange interaction via the metal film made of Ru, Ir, and so forth. In such a case, a crystal structure of the ferromagnetic film 1003 can be selected regardless of a crystal structure of the substrate film 1004, and in the case where the CoFeB film is used for the ferromagnetic film 1003, in particular, the CoFeB film can be turned into an amorphous structure high in quality immediately after film-formation, so that the MgO film growing on the CoFeB film can be turned into a (001) orientation film high in quality, whereupon a threshold voltage at switching caused by an electric field can be reduced, and the TMR ratio of the detection part 1008 can be enhanced.

Use of a structure according to the second embodiment of the invention has a merit in that material having optimum spin-wave propagation characteristic can be selected for the perpendicularly magnetized film 1004, and material optimum for magnetization switching by an electric field, or excitation of a spin wave can be selected for the insulating film 1002, and the ferromagnetic film 1003 having the longitudinal magnetic anisotropy. Further, the perpendicularly magnetized film 1004 can be optimally designed so as to have a thickness small in spin-wave propagation loss. Thus, it is possible to considerably expand a scope of a specification applicable to the present spin-wave waveguide.

What is claimed is:

1. A spin-wave waveguide comprising:
    a ferromagnetic film including a first part, a second part and a third part arranged with the second part extending between the first part and the third part;
    an insulating film stacked over the first part of the ferromagnetic film; and
    an electrode film stacked over the insulating film and the first part of the ferromagnetic film,
    wherein the second part has a film thickness which is smaller than that of the first part and the third part,
    wherein magnetic anisotropy of the first part of the ferromagnetic film is parallel with a surface of the ferromagnetic film, and
    wherein magnetic anisotropy of the second part of the ferromagnetic film is perpendicular to the surface of the ferromagnetic film.

2. The spin-wave waveguide according to claim 1, wherein the ferromagnetic film is comprised of Co and Fe, an alloy of Co and Fe, a metal comprised of Co and Fe, or the alloy of Co and Fe and also containing B.

3. A spin-wave waveguide comprising:
    a first ferromagnetic film which is wire-shaped;
    a second ferromagnetic thin film differing from the first ferromagnetic film;
    an insulating film; and
    an electrode film,
    wherein the second ferromagnetic film, the insulating film, and the electrode film are stacked in order on the first ferromagnetic film as a stacked film, and a first portion of the first ferromagnetic film provided with the stacked film and a second portion of the first ferromagnetic film not provided with the stacked film are adjacently formed in a direction in which the first ferromagnetic film extends, and
    wherein magnetic anisotropy of the first ferromagnetic film is perpendicular to a surface thereof while magnetic anisotropy of a portion of the second ferromagnetic film is oriented in-plane.

4. The spin-wave waveguide according to claim 3, wherein the second ferromagnetic film is comprised of Co and Fe, an alloy made of Co, and Fe, a metal comprised of Co and Fe, or an alloy of Co and Fe containing B.

5. The spin-wave waveguide according to claim 3, wherein the first ferromagnetic film is an alloy containing any element selected from the group consisting of Co, Fe, and Ni, or a plurality of elements selected from the group consisting of Co, Fe, and Ni together with any element selected from the group consisting of Pt, and Pd.

6. The spin-wave waveguide according to claim 1, wherein the insulating film is an MgO film.

7. The spin-wave waveguide according to claim 1, wherein the insulating film is an oxide, a nitride, or an oxynitride, containing at least one element selected from the group consisting of Al, Zn, Ti, Zr, Ni, SI, and Fe.

8. The spin-wave waveguide according to claim 3, wherein a metal film is disposed between the first ferromagnetic film and the second ferromagnetic film, and magnetization of the first ferromagnetic film is magnetically coupled to magnetization of the second ferromagnetic film via the metal film.

9. The spin-wave waveguide according to claim 1, wherein the electrode film is formed at one end of the spin-wave waveguide and is a non-magnetic metal.

10. The spin-wave waveguide according to claim 1, wherein the electrode film is formed at one end of the spin-wave waveguide and is a ferromagnetic film.

11. A spin wave operation circuit comprising:
a spin-wave waveguide comprising:
- a wire-shaped, ferromagnetic film a ferromagnetic film including a first part having a larger film thickness, a second part having a smaller film thickness and a third part having a larger film thickness which are alternately formed on a same plane for at least one cycle, where the first part of the ferromagnetic film is formed at one end of the ferromagnetic film and the third part of the ferromagnetic film is formed at another end of the ferromagnetic film;
- an insulating film is stacked over the first part of the ferromagnetic film; and
- a first electrode film is stacked over the insulating film and the first part of the ferromagnetic film,
- wherein magnetic anisotropy of the first part of the ferromagnetic film is parallel with a surface of the ferromagnetic film,
- wherein magnetic anisotropy of the second part of the ferromagnetic film is perpendicular to the surface of the ferromagnetic film;

means for transmitting a signal to the first electrode film of the spin-wave waveguide;
wherein the first electrode film at the one end of the spin-wave waveguide is for signal-writing or for excitation of a spin wave propagating through the ferromagnetic film, and
wherein a second electrode film is stacked over the third part of the ferromagnetic film having at the other end of the ferromagnetic film and is for signal-reading.

12. The spin wave operation circuit according to claim 11, wherein a plurality of the spin-wave waveguides intersect each other in a region where the signal-writing, the excitation of the spin wave, or the signal-reading is executed.

13. The spin wave operation circuit according to claim 11, wherein a wavelength ($\lambda$) of the spin wave and a width (w) of ferromagnetic film is defined as $\lambda<w$, and a plurality of the spin-wave waveguides intersect each other in a region other than a region where the signal-writing, the excitation of the spin wave, and the signal-reading are executed.

14. The spin wave operation circuit according to claim 11, wherein a voltage larger than a predetermined threshold voltage Vth and having a predetermined pulse width is applied to the electrode film so that information is written to the first part of the ferromagnetic film.

15. The spin-wave waveguide according to claim 3, wherein the first ferromagnetic film is an alternatingly stacked film comprised of any element selected from the group consisting of Co, Fe, and Ni, or a plurality of elements selected from the group consisting of Co, Fe, and Ni together with any element selected from the group consisting of Pt, and Pd, or an alternatingly stacked film comprised of Co, Fe or an alloy containing Co or Fe together with Ni.

16. The spin-wave waveguide according to claim 1, wherein the ferromagnetic film is wire-shaped.

* * * * *